US009257322B2

(12) United States Patent
Chen et al.

(10) Patent No.: US 9,257,322 B2
(45) Date of Patent: Feb. 9, 2016

(54) METHOD FOR MANUFACTURING THROUGH SUBSTRATE VIA (TSV), STRUCTURE AND CONTROL METHOD OF TSV CAPACITANCE

(75) Inventors: Erh-Hao Chen, Changhua County (TW); Cha-Hsin Lin, Miaoli County (TW); Tzu-Kun Ku, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 350 days.

(21) Appl. No.: 13/598,586

(22) Filed: Aug. 29, 2012

(65) Prior Publication Data

US 2014/0008800 A1 Jan. 9, 2014

(30) Foreign Application Priority Data

Jul. 4, 2012 (TW) .............................. 101124060 A

(51) Int. Cl.
*H01L 21/74* (2006.01)
*H01L 21/768* (2006.01)
*H01L 23/48* (2006.01)
*H01L 21/02* (2006.01)

(52) U.S. Cl.
CPC ........ *H01L 21/743* (2013.01); *H01L 21/02107* (2013.01); *H01L 21/76898* (2013.01); *H01L 23/481* (2013.01); *H01L 2924/0002* (2013.01)

(58) Field of Classification Search
CPC .................................................. H01L 29/66727
USPC ................................... 438/667, 638–639, 109
See application file for complete search history.

(56) References Cited

U.S. PATENT DOCUMENTS

| 4,420,504 | A | * | 12/1983 | Cooper et al. | 438/601 |
| 5,477,071 | A | * | 12/1995 | Hamamoto et al. | 257/302 |
| 5,889,314 | A | * | 3/1999 | Hirabayashi | 257/508 |
| 5,990,011 | A | * | 11/1999 | McTeer | 438/692 |
| 6,100,194 | A | * | 8/2000 | Chan et al. | 438/686 |
| 6,316,336 | B1 | * | 11/2001 | Blanchard | 438/478 |
| 6,437,388 | B1 | * | 8/2002 | Radens et al. | 257/301 |

(Continued)

FOREIGN PATENT DOCUMENTS

CN 101447479 6/2009

OTHER PUBLICATIONS

Nagesh Vodrahalli, "Silicon TSV Interposers with embedded capacitors for high performance VLSI packaging," IEEE CPMT Symposium Japan, Aug. 24-26, 2010, pp. 1-4.

(Continued)

*Primary Examiner* — Jerome Jackson, Jr.
*Assistant Examiner* — Ankush Singal
(74) *Attorney, Agent, or Firm* — Jianq Chyun IP Office

(57) ABSTRACT

A method for manufacturing a through substrate via (TSV) structure, a TSV structure, and a control method of a TSV capacitance are provided. The method for manufacturing the TSV structure includes: providing a substrate having a first surface and a second surface; forming a trench in the first surface of the substrate; filling a low resistance material into the trench; forming an insulating layer on the first surface of the substrate; forming at least one opening in the first surface of the substrate, wherein the opening is located differently the trench; forming an oxide liner layer, a barrier layer and a conductive seed layer on a sidewall and a bottom of the opening and on the insulating layer of the first surface; and filling a conductive material into the opening, wherein the opening is used to form at least one via.

16 Claims, 14 Drawing Sheets

(56) References Cited

U.S. PATENT DOCUMENTS

| | | | | |
|---|---|---|---|---|
| 6,852,597 | B2* | 2/2005 | Park et al. | 438/268 |
| 6,888,196 | B2* | 5/2005 | Kobayashi | 257/330 |
| 7,183,615 | B2* | 2/2007 | Yamashita et al. | 257/390 |
| 7,304,341 | B2* | 12/2007 | Mikawa et al. | 257/296 |
| 7,304,384 | B2* | 12/2007 | Koike et al. | 257/751 |
| 7,399,676 | B2* | 7/2008 | Kumar et al. | 438/268 |
| 7,595,521 | B2* | 9/2009 | Hanson et al. | 257/296 |
| 7,795,137 | B2* | 9/2010 | Saito et al. | 438/637 |
| 7,800,234 | B2* | 9/2010 | Marchi et al. | 257/774 |
| 7,977,766 | B2* | 7/2011 | Booth et al. | 257/530 |
| 8,053,823 | B2 | 11/2011 | Cheng et al. | |
| 8,067,796 | B2* | 11/2011 | Hirler et al. | 257/328 |
| 8,120,113 | B2* | 2/2012 | Choi et al. | 257/357 |
| 8,163,614 | B2* | 4/2012 | Kim et al. | 438/257 |
| 8,343,836 | B2* | 1/2013 | Anderson et al. | 438/270 |
| 8,354,678 | B1* | 1/2013 | Fox et al. | 257/77 |
| 2003/0162356 | A1* | 8/2003 | Kawanaka | 438/275 |
| 2003/0178676 | A1* | 9/2003 | Henninger et al. | 257/340 |
| 2003/0186507 | A1* | 10/2003 | Henninger et al. | 438/270 |
| 2004/0067607 | A1* | 4/2004 | Shin et al. | 438/128 |
| 2004/0087104 | A1* | 5/2004 | Barry et al. | 438/424 |
| 2004/0094786 | A1* | 5/2004 | Tran et al. | 257/296 |
| 2006/0091463 | A1* | 5/2006 | Donze et al. | 257/353 |
| 2006/0134930 | A1* | 6/2006 | Jeon | 438/798 |
| 2006/0145247 | A1* | 7/2006 | Zundel et al. | 257/330 |
| 2006/0273380 | A1* | 12/2006 | Hshieh | 257/330 |
| 2006/0273384 | A1* | 12/2006 | Hshieh | 257/330 |
| 2006/0273385 | A1* | 12/2006 | Hshieh | 257/330 |
| 2006/0292816 | A1* | 12/2006 | Mikawa et al. | 438/396 |
| 2007/0093019 | A1* | 4/2007 | Rieger et al. | 438/243 |
| 2007/0235801 | A1* | 10/2007 | Cheng et al. | 257/330 |
| 2008/0079081 | A1* | 4/2008 | Hashimoto | 257/363 |
| 2008/0169494 | A1* | 7/2008 | Cheng et al. | 257/302 |
| 2008/0188076 | A1* | 8/2008 | Morinaga et al. | 438/648 |
| 2008/0246082 | A1* | 10/2008 | Hshieh | 257/333 |
| 2008/0265279 | A1* | 10/2008 | Foerster | 257/190 |
| 2009/0072288 | A1* | 3/2009 | Hanson et al. | 257/296 |
| 2009/0134429 | A1* | 5/2009 | Greenberg et al. | 257/198 |
| 2009/0134500 | A1 | 5/2009 | Kuo | |
| 2009/0152624 | A1* | 6/2009 | Hiller et al. | 257/330 |
| 2009/0256197 | A1* | 10/2009 | Nakazawa et al. | 257/334 |
| 2009/0301543 | A1* | 12/2009 | Reddy et al. | 136/244 |
| 2009/0305475 | A1* | 12/2009 | Hshieh | 438/237 |
| 2009/0315103 | A1* | 12/2009 | Hsieh | 257/330 |
| 2009/0315104 | A1* | 12/2009 | Hsieh | 257/330 |
| 2010/0127345 | A1 | 5/2010 | Sanders et al. | |
| 2010/0176448 | A1* | 7/2010 | Hsieh | 257/334 |
| 2011/0027962 | A1 | 2/2011 | Bernstein et al. | |
| 2011/0136268 | A1* | 6/2011 | Brannon et al. | 438/5 |
| 2011/0169131 | A1 | 7/2011 | Nakos et al. | |
| 2011/0278666 | A1* | 11/2011 | Liu et al. | 257/334 |
| 2011/0294289 | A1* | 12/2011 | Rieger et al. | 438/653 |
| 2012/0080802 | A1* | 4/2012 | Cheng et al. | 257/774 |
| 2012/0156872 | A1* | 6/2012 | Cao | 438/643 |
| 2012/0161286 | A1* | 6/2012 | Bhalla | 257/577 |
| 2012/0217513 | A1* | 8/2012 | Tega et al. | 257/77 |
| 2013/0037953 | A1* | 2/2013 | Chen et al. | 257/751 |
| 2013/0221428 | A1* | 8/2013 | Venkatraman et al. | 257/330 |

OTHER PUBLICATIONS

Sun et al., "Electrical Characterization of Sidewall Insulation Layer of TSV," 2010 11th International Conference on Electronic Packaging Technology & High Density Packaging, Aug. 16-19, 2010, pp. 77-80.

Song et al., "Decoupling Capacitor Stacked Chip (DCSC) in TSV-based 3D-ICs." 2011 IEEE 20th Conference on Electrical Performance of Electronic Packaging and Systems, Oct. 23-26, 2011, pp. 235-238.

Dang et al., "3D Chip Stack with Integrated Decoupling Capacitors," Electronic Components and Technology Conference, May 26-29, 2009, pp. 1-5.

Wang et al., "Solution-Derived Electrodes and Dielectrics for Low-Cost and High-Capacitance Trench and Through-Silicon-Via (TSV) Capacitors," Electronic Components and Technology Conference, May 31-Jun. 3, 2011, pp. 1987-1991.

* cited by examiner

METHOD FOR MANUFACTURING THROUGH SUBSTRATE VIA (TSV), STRUCTURE AND CONTROL METHOD OF TSV CAPACITANCE

CROSS-REFERENCE TO RELATED APPLICATION

This application claims the priority benefit of Taiwan application serial no. 101124060, filed on Jul. 4, 2012. The entirety of the above-mentioned patent application is hereby incorporated by reference herein and made a part of this specification.

TECHNICAL FIELD

The disclosure relates to a chip stacking technology, to a method for manufacturing a through substrate via (TSV), a structure and control method of a TSV capacitance.

BACKGROUND

Along with the progress in semiconductor technology, to increase the integrity of semiconductor devices and to satisfy the demand of high device performance, the chip stacking technology has been developed rapidly. Particularly, the through-silicon-via (TSV) technology is deemed as a new-generation interconnect applied in the three-dimensional (3D) integrated circuit (IC) technology.

The TSV technology applied in the 3D stacking of ICs is, for example, forming a hole with a high aspect ratio in a first surface (front side) of a substrate of chip first, and then filling a conductive material into the hole. Then, a chemical/mechanical polishing process is performed to remove the conductive material outside the hole. Then, a portion of a second surface (back side) of the substrate is removed to thin the substrate and expose the conductive material in the hole. Next, a plurality of chips are bonded together by stacking, and the chips are electrically connected through the conductive material in the hole.

Since in the TSV technology, the substrate of the chips is penetrated, the stacked chips are able to transmit signals to one another. Such approach is different from the traditional circuit layout technology in which circuit devices are manufactured on a substrate surface. Therefore, the TSV technology also produces many new problems to be solved, such as how to control a metal oxide semiconductor (MOS) capacitance device that appears together with a conductive via precisely, how to reduce the signal coupling between two adjacent conductive vias, and how to eliminate the noise in the substrate.

SUMMARY

A method for manufacturing a TSV provided in the disclosure includes the following steps. First, a substrate having a first surface and a second surface is provided. A trench is formed in the first surface of the substrate. A low resistance material is filled into the trench, and an insulating layer is formed on the first surface of the substrate. At least one opening is formed in the first surface of the substrate, wherein a location of the opening is different from a location of the trench. An oxide liner layer, a barrier layer and a conductive seed layer are formed sequentially on a sidewall and a bottom of the at least one opening as well as the insulating layer of the first surface. And a conductive material is filled into the at least one opening, wherein the opening is used to form at least one via.

A TSV structure which includes a substrate, a trench, a low resistance material, an insulating layer, at least one opening, an oxide liner layer, a barrier layer, a conductive seed layer, and a conductive material is provided in the disclosure. The substrate has a first surface and a second surface. The trench is located in the first surface of the substrate. The low resistance material is filled into the trench. The insulating layer is on the first surface of the substrate. The at least one opening is located in the first surface of the substrate, wherein a location of the at least one opening is different from a location of the trench. The oxide liner layer, the barrier layer and the conductive seed layer are located on a sidewall and a bottom of the opening as well as the insulating layer of the first surface. The conductive material is filled into the at least one opening, wherein the at least one opening is used to form at least one via.

A TSV structure which includes a substrate, an insulating layer, a trench, and a plurality of openings is provided in the disclosure. The substrate has a first surface and a second surface. An insulating layer is located on the first surface of the substrate. The trench is located in the first surface of the substrate, and a low resistance material is filled into the trench. The openings are located in the first surface of the substrate, wherein locations of the openings are different from a location of the trench, and a conductive material is filled into the openings, wherein the location of the trench is at a geometric center with respect to the openings.

A control method of a TSV capacitance which includes a substrate and a TSV capacitance is provided in the disclosure. The substrate has a first surface and a second surface, wherein at least one opening is foil red in the first surface of the substrate, and a conductive material, a conductive seed layer, a barrier layer and an oxide liner layer are disposed on a sidewall of the at least one opening to form the TSV capacitance. A first voltage is applied to the conductive material of the at least one opening, and a second voltage is applied to the substrate to control the TSV capacitance.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

First Embodiment

FIGS. 1 to 12 are schematic flowcharts illustrating a method for manufacturing a TSV structure according to the first embodiment of the disclosure. First, referring to FIG. 1, a substrate 100 having a first surface 101 and a second surface 102 is provided. According to the embodiments of the disclosure, the substrate 100 is, for example, a silicon substrate (e.g. a wafer) or other suitable semiconductor substrate materials. Generally speaking, the first surface 101 of the substrate 100 may be referred to as a back surface, and the second surface 102 of the substrate 100 may be referred to as a top surface. In addition, a trench 200 is formed in the first surface 101 of the substrate 100. Herein, a method of forming the trench 200 is, for example, using a photoresist layer on the first surface 101 as an etching mask, wherein the photoresist layer includes an opening at the trench 200 so as to etch the substrate 100 to form the trench 200.

Figure 2:
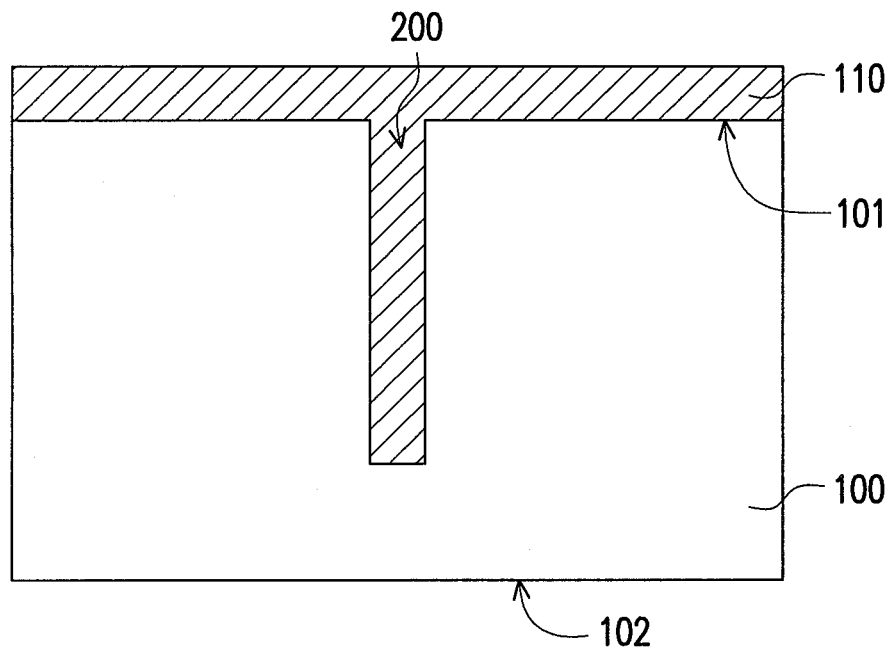
Figure 3:
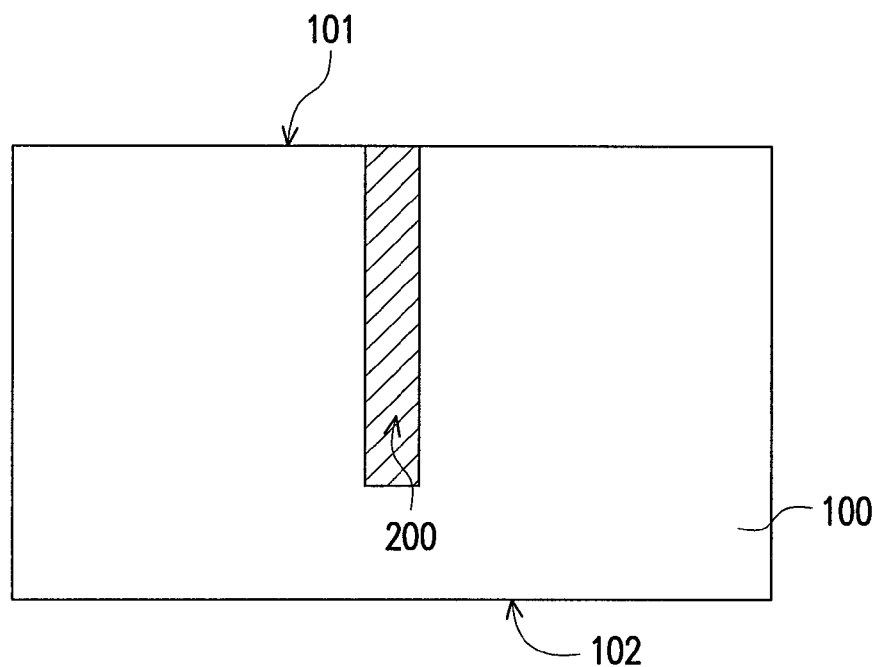

Then, referring to FIGS. 2 and 3, low resistance material is filled into the trench 200. In the first embodiment, first, a method of filling the low resistance material into the trench 200 is, for example, forming a low resistance epi-layer 110 on the first surface 101 of the substrate 100 of FIG. 2, so that the trench 200 may be filled with the low resistance material contained in the low resistance epi-layer 110. Then, in FIG. 3, the low resistance epi-layer 110 on the first surface 101 is removed through a polishing process or other related processes, so that the low resistance material is filled into the trench 200. In the embodiments of the disclosure, the low resistance material may be a material with a lower impedance value such as p-type silicon (e.g. p-type doped silicon), n-type silicon (e.g. n-type doped silicon), or a conductive metal. In implementations conforming to the embodiments of the disclosure, the low resistance epi-layer 110 may be formed by deposition.

Figure 4:
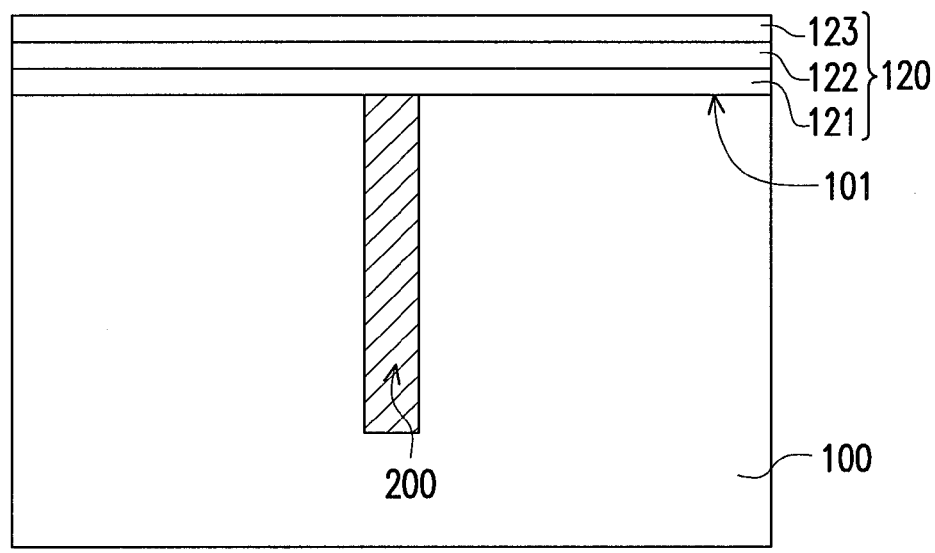

Referring to FIG. 4, an insulating layer 120 is formed on the first surface 101 of the substrate 100. In the present embodiment, the insulating layer 120 is formed by three insulating layers. The embodiments of the disclosure are implemented by a first silicon nitride (SiN) layer 121, a first silicon oxide (SiO) layer 122 and a second SiN layer 123, but the disclosure is not limited thereto. The insulating layer 120 may also be, for example, a three-stack layer of SiO, silicon oxynitride (SiON) and SiO.

Figure 5:
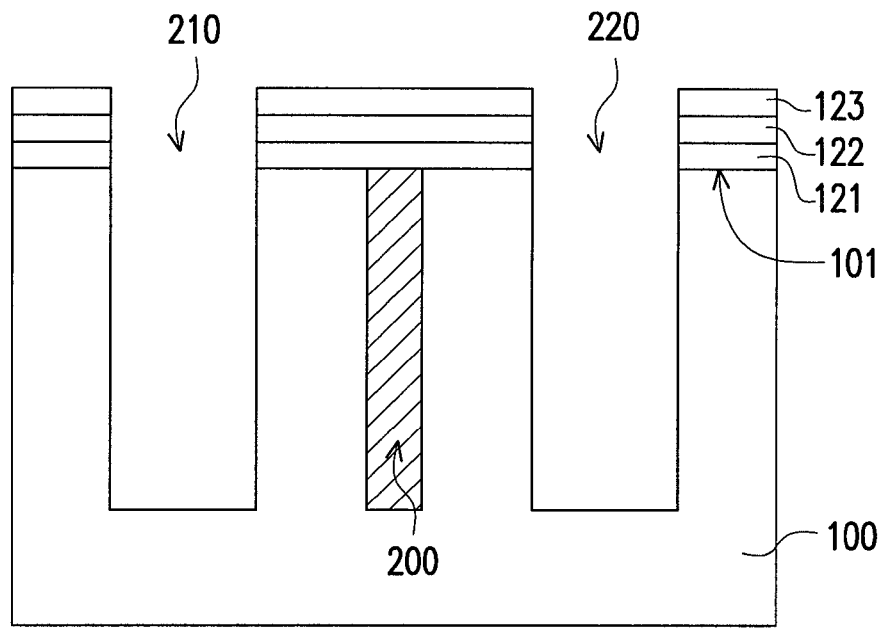
Figure 6:
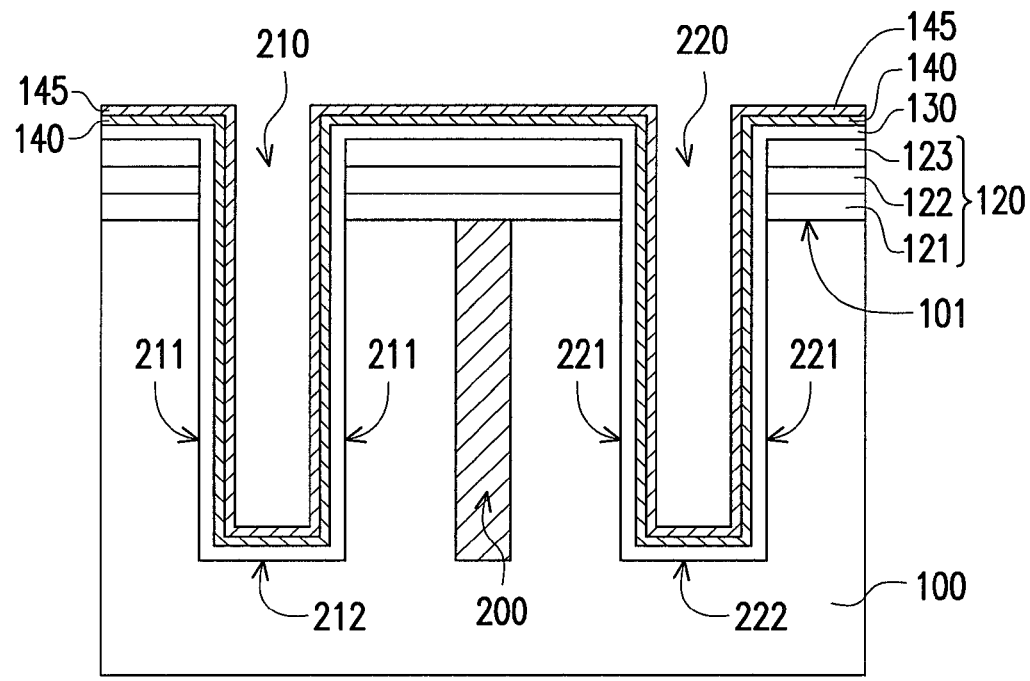

Referring to FIG. 5, at least one opening is formed/etched in the first surface 101 of the substrate 100. Two openings 210 and 220 are illustrated in the embodiments of the disclosure, and yet the number of the openings in the disclosure is not limited thereto. The locations of the openings 210 and 220 in FIG. 5 are different from the location of the trench 200. Then, referring to FIG. 6, an oxide liner layer 130, a barrier layer 140 and a conductive seed layer 145 are formed on sidewalls and bottoms of the openings 210 and 220 as well as the insulating layer 120 of the first surface 101. In FIG. 6, the oxide liner layer 130, the barrier layer 140 and the conductive seed layer 145 are formed on a sidewall 211 and a bottom 212 of the opening 210 as well as a sidewall 221 and a bottom 222 of the opening 220 from exterior to interior. The barrier layer 140 may be tantalum or tantalum nitride but is not limited thereto. The conductive seed layer 145 has a single-layered structure or a multi-layered structure composed of at least one of the following metal materials: copper, nickel, chromium, gold, tin, silver, and alloys thereof.

Figure 7:
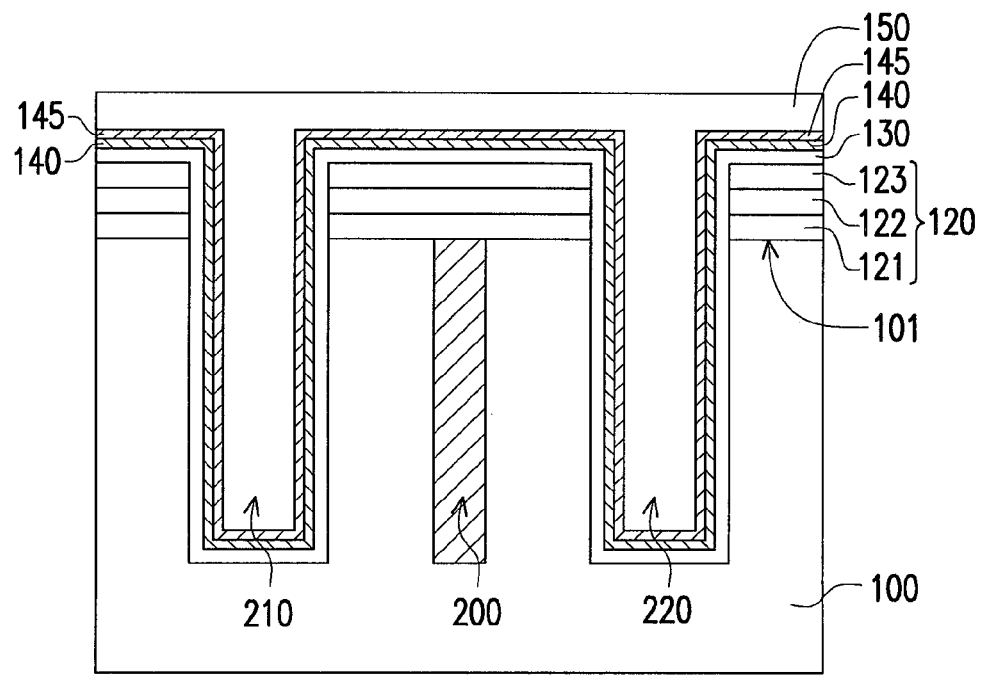
Figure 8:
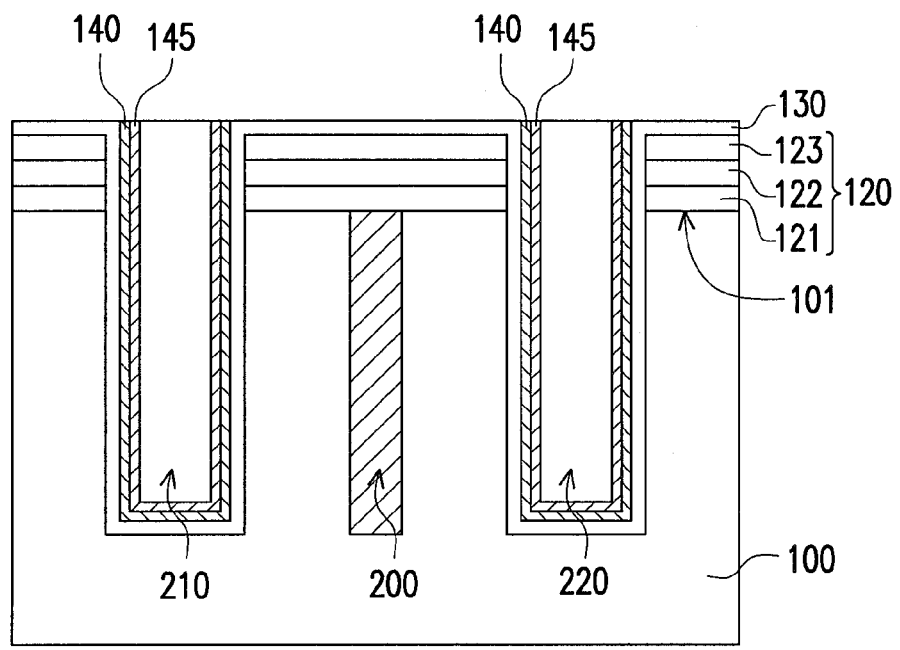

Referring to FIGS. 7 and 8, after the oxide liner layer 130, the barrier layer 140 and the conductive seed layer 145 are formed, conductive material is filled into the openings 210 and 220. In the embodiments of the disclosure, the method of filling the conductive material into the openings 210 and 220 is, for example, forming a conductive layer 150 containing the conductive material (e.g. copper) on the conductive seed layer 145 above the first surface 101 through an electrochemical plating (ECP) process in FIG. 7. Then, in FIG. 8, the conductive layer 150, the barrier layer 140 and the conductive seed layer 145 on the oxide liner layer 130 are removed through a chemical mechanical polishing (CMP) process while the conductive material (copper) has already been filled into the openings 210 and 220. Therefore, the conductive material, the conductive seed layer 145, the barrier layer 140, and the oxide liner layer 130 are disposed on the openings 210 and 220 from interior to exterior in the embodiments of the disclosure.

Figure 9:
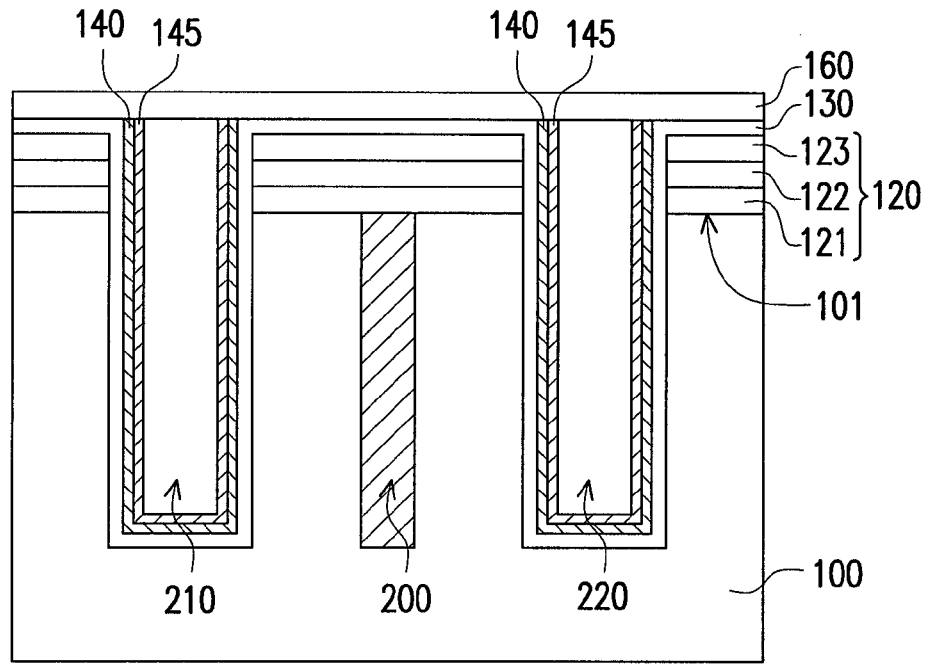

Referring to FIG. 9, after the polishing is completed through the CMP process, a dielectric layer 160 is formed on the oxide liner layer 130 above the first surface 101. A SiN layer is used as an illustration of the dielectric layer 160 in the embodiments of the disclosure. Then, referring to FIG. 10, a body contact hole 230 is formed/etched on the first surface 101 of the substrate 100, wherein the location of the body contact hole 230 is the same as the location of the trench 200. The depth of the body contact hole 230 in the embodiments of the disclosure is greater than the sum of the thickness of the dielectric layer 160, the oxide liner layer 130 and the insulating layer 120, so that the body contact hole 230 is able to expose the trench 200.

Figure 11:
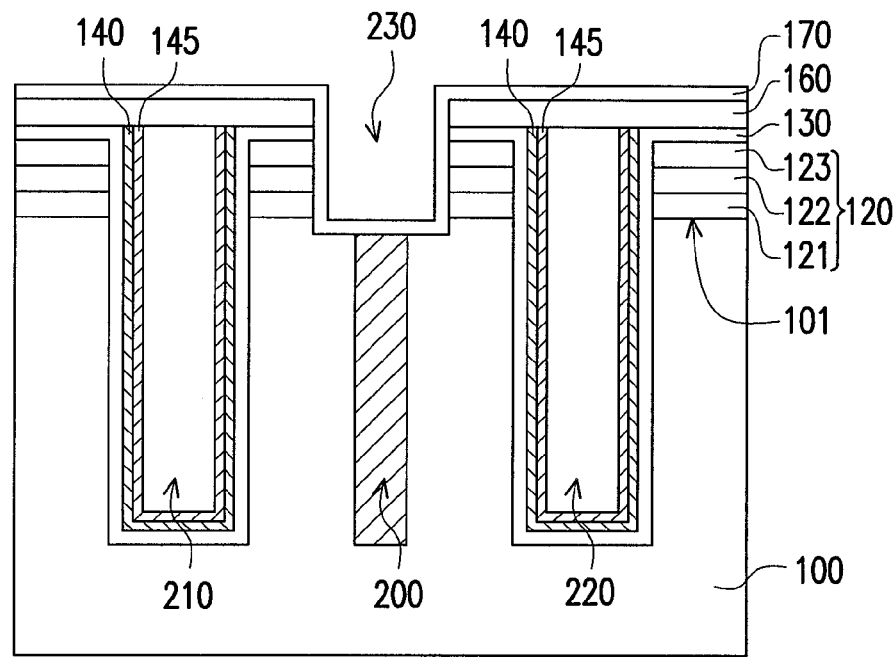
Figure 12:
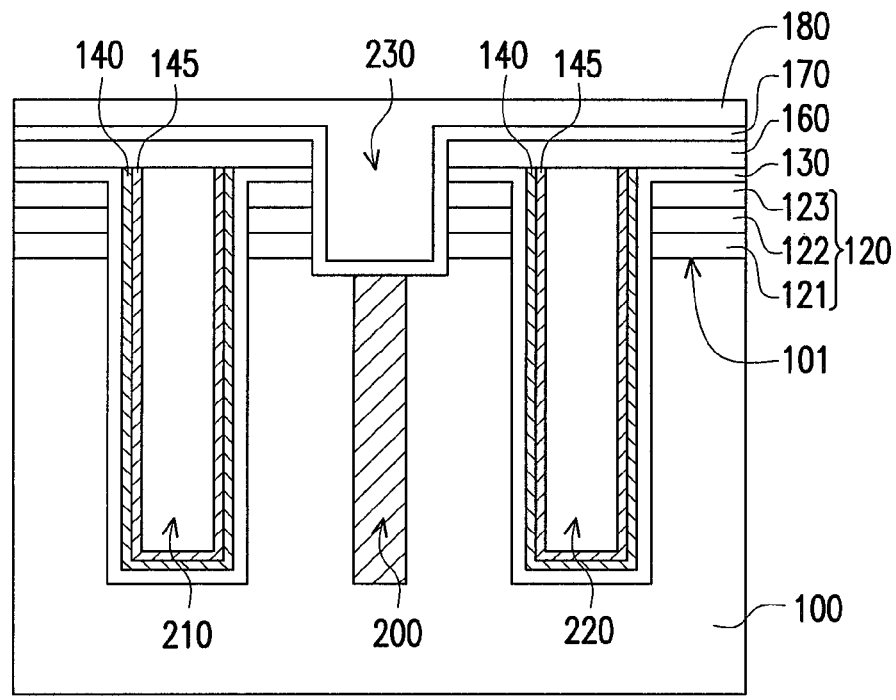

Referring to FIG. 11, after the body contact hole 230 is formed, when the present embodiment is applied, if necessary, a liner layer 170 may be formed on a sidewall and a bottom of the body contact hole 230 as well as the dielectric layer 160 above the first surface 101. In some embodiments, the liner layer 170 is not necessarily to be formed. Referring to FIG. 12, a conductive layer 180 having conductive material is filled into the body contact hole 230 to form a conductive port. The openings 210 and 220 may be used to formed vias. In other words, a portion of the second surface 102 of the substrate 100 is removed to thin the substrate 100 and expose the conductive material in the openings 210 and 220 through the CMP process. Then, the openings 210 and 220 may become the vias because the conductive material of the openings 210 and 220 penetrates the substrate 100. The vias are conductive holes passing though the substrate 100, so as to conduct two circuits isolated by the substrate 100.

In light of the above, the TSV structure in the embodiments of the disclosure may use the openings 210 and 220, the trench 200 filled with the low resistance material filled, and the body contact hole 230 to form a capacitance device of a metal oxide semiconductor (MOS). Since the conductive port shown in FIG. 12 conducts the trench 200 filled with the low resistance material, the electric potential at the conductive port on a surface of the substrate 100 is not affected by an internal resistance of the substrate 100 and may not decay. Hence, the conductive port is able to extend to a bottom of the substrate 100, and an electric potential from the surface of the substrate 100 to the bottom of the substrate 100 may be adjusted with precision, so that the control over the MOS capacitance device in the sidewalls of the openings 210 and 220 may be facilitated. Accordingly, the noise generated in the substrate 100 and the signal coupling between the openings 210 and 220 may be reduced.

Figure 13A:
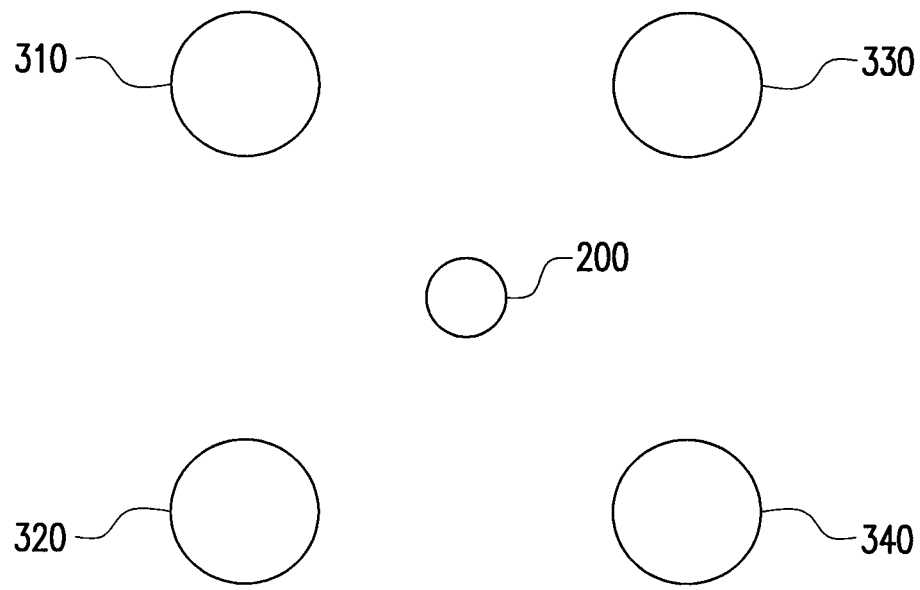
FIGS. 13A to 13C are schematic views of the corresponding locations of openings with respect to a trench according to the embodiments of the disclosure.
Figure 13B:
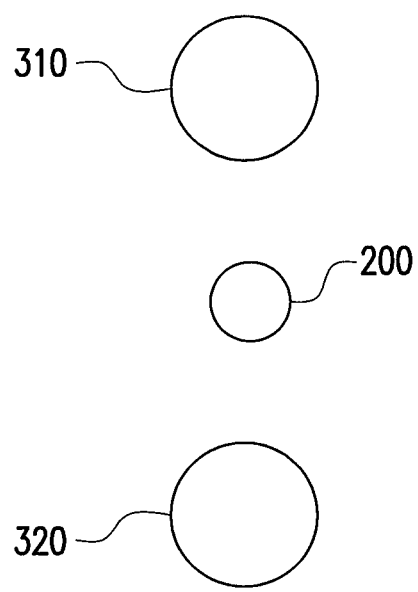
Figure 13C:
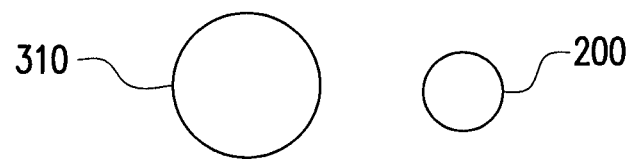
Figure 14:
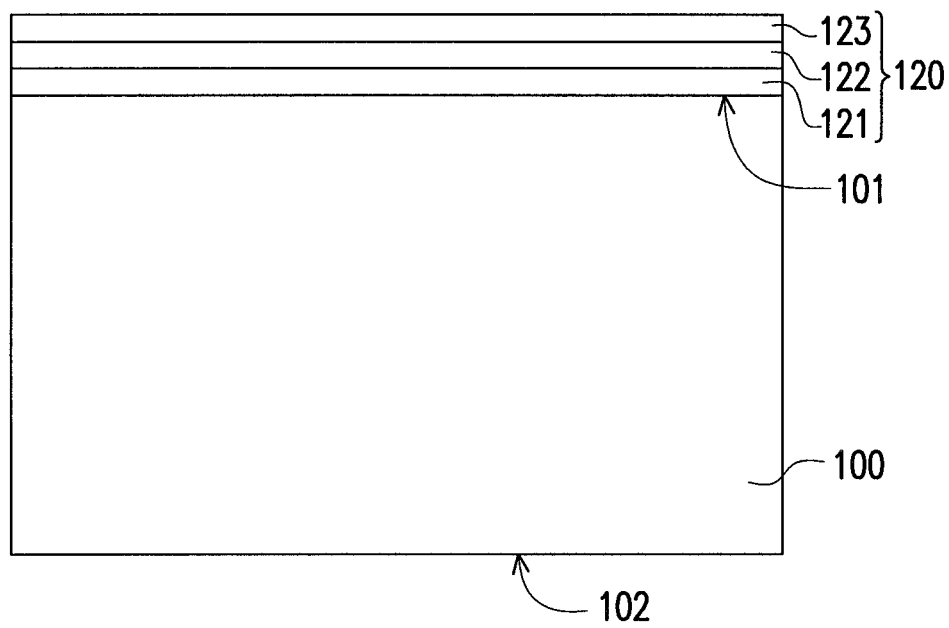
FIGS. 14 to 20 are schematic flowcharts of a method for manufacturing a TSV structure according to the second embodiment of the disclosure.

The trench 200 described in FIGS. 1 to 12 allows the electric potential from the surface to the bottom of the substrate 100 to be adjusted precisely and reduces the signal coupling between the openings. While there exist a plurality of openings in the embodiments of the disclosure, the trench may be disposed at a geometric center with respect to the plurality of openings. FIGS. 13A to 13C are schematic views of the corresponding locations of openings 310-340 with respect to the trench 200 according to the embodiments of the disclosure. FIGS. 13A to 13C are schematic views viewing from the top of the first surface of the substrate; therefore, each of the openings 310-340 and the trench 200 are circles. In addition, FIGS. 13A to 13C are applicable not only for the first embodiment but also for the following second and third embodiments. Referring to FIG. 13A, if the four adjacent openings 310-340 are disposed in a rectangular shape, the trench 200 is placed at the geometric center of the rectangle. As shown in FIG. 13B, if the two adjacent openings 310 and 320 are disposed in a line, the trench 200 is disposed at the midpoint of the opening 310 and the opening 320, i.e., the geometric center of the openings 310 and 320. As shown in FIG. 13C, when there is the one opening 310, the trench 200 is placed at adjacent areas.

The diameters of the trench and the openings in the embodiments of the disclosure are in the range of about 0.1 nm to about 3 mm, in the range of about 1 µm to about 30 µm. In terms of the depths of the trench and the openings in the substrate, the ratio of the depth of the trench in the substrate to the depth of the openings in the substrate is in the range of 0.1% to 99.9%. In other words, the depth of the trench can be less than or similar to the depth of the openings. The ratio of the depth of the trench to the depth of the openings can be in the range of 70% to 99.9%.

In the TSV structure of FIG. 12, the MOS capacitance device is formed in the sidewalls of the openings 210 and 220. The TSV structure is used to control the capacitance device to reduce the noise generated in the substrate 100 and the signal coupling between the openings 210 and 220 in the disclosure. Therefore, a control method of a TSV capacitance (or called a voltage applying method) is provided herein and the TSV capacitance of the sidewall of the opening 210 in FIG. 12 is taken as an example.

First, the substrate 100 and the TSV capacitance are provided. The TSV structure of FIG. 12 may form the openings 210 and 220, and the conductive material, the conductive seed layer 145, the barrier layer 140, and the oxide liner layer 130 are sequentially disposed from interior to exterior on the sidewall of the opening 210. The TSV capacitance takes the conductive material in the opening 210 as a first electrode, the substrate 100 as a second electrode, and a dielectric material (such as the oxide liner layer 130) contained in the sidewall of the opening 210 as a dielectric layer, and the TSV capacitance is thereby formed.

Next, a first voltage may be applied to the conductive material in the opening 210, and a second voltage is applied to the substrate 100 simultaneously, so as to control the TSV capacitance. One way to apply the second voltage to the substrate 100 may be guiding the second voltage into the substrate 100 through the trench 200 filled with the low resistance material and the body contact hole 230, so that the electric potential of the conductive port on the surface of the substrate 100 does not decay due to the influence of the internal resistance of the substrate 100. For other details, please refer to the descriptions of the corresponding embodiments.

Figure 1:
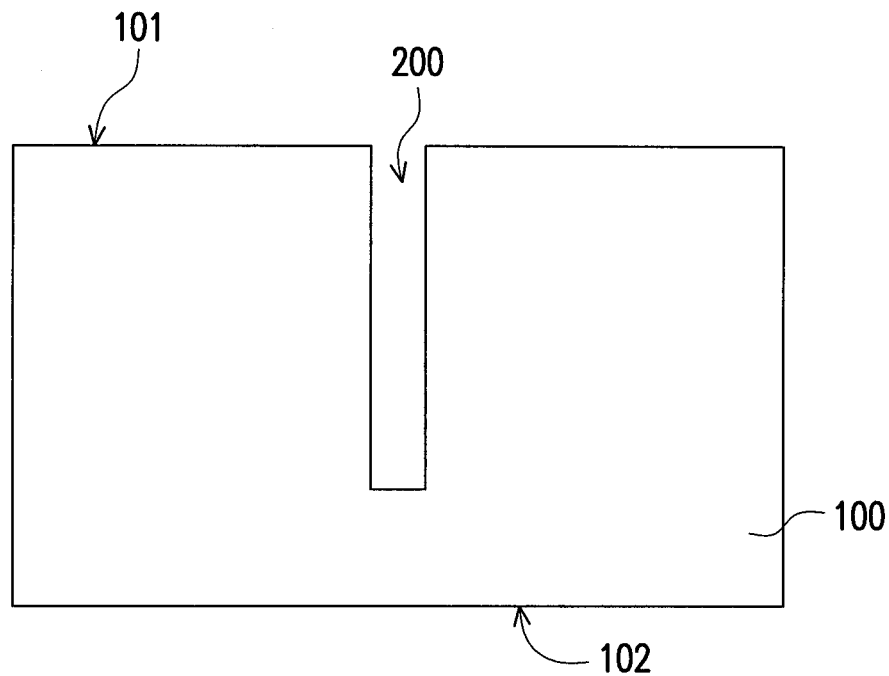
FIGS. 1 to 12 are schematic flowcharts of a method for manufacturing a TSV structure according to the first embodiment of the disclosure.
Figure 10:
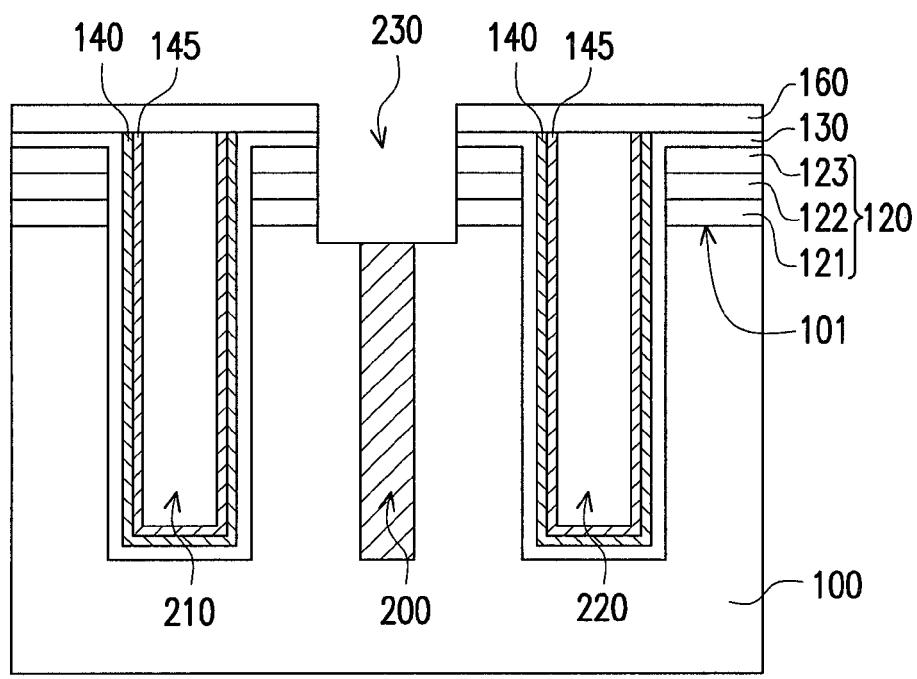

In addition, in the embodiment disclosed by the first embodiment, after the trench 200 filled with the low resistance material in FIGS. 1 to 3 is disposed, the openings 210 and 220 filled with the conductive material in FIGS. 5 to 8 are then disposed. The body contact hole 230 connected with the trench 200 in FIGS. 10 to 12 is disposed. However, a person who uses this embodiment may dispose the openings first and then dispose the trench and the body contact hole as illustrated in the following second embodiment. Alternatively, the openings and the trench may be disposed at the same time and the body contact plug may be disposed in the end as illustrated in the following third embodiment so as to simplify the steps in the processes while meeting the spirit of the embodiments of the disclosure and achieving the same effects as well.

Second Embodiment

FIGS. 14 to 20 are schematic flowcharts of a method for manufacturing a TSV structure according to the second embodiment of the disclosure. The major difference between the second embodiment and the first embodiment is that the order of each manufacturing step is adjusted; therefore, please refer to the first embodiment for the details omitted herein. First, referring to FIG. 14, a substrate 100 having a first surface 101 and a second surface 102 is provided. In addition, an insulating layer 120 is formed on the first surface 101 of the substrate 100. In the present embodiment, the insulating layer 120 is formed by three insulating layers such as a first SiN layer 121, a first SiO layer 122 and a second SiN layer 123.

Figure 15:
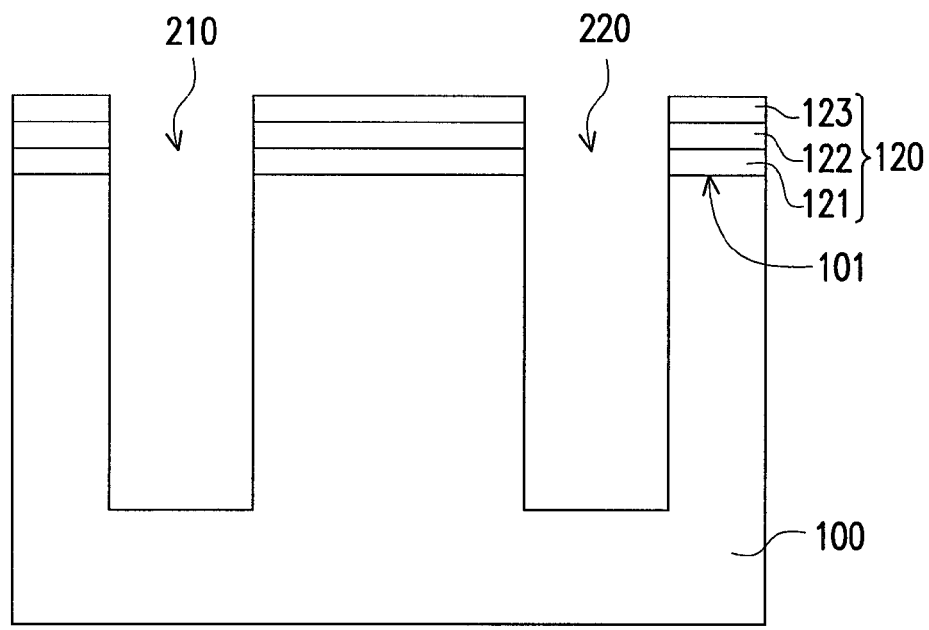
Figure 16:
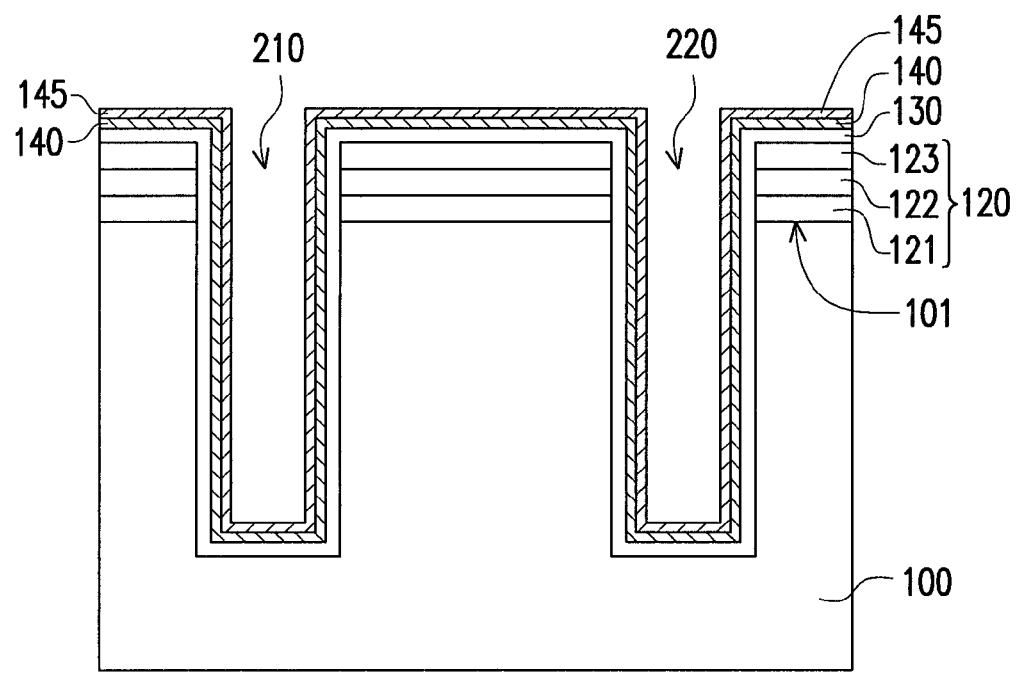
Figure 17:
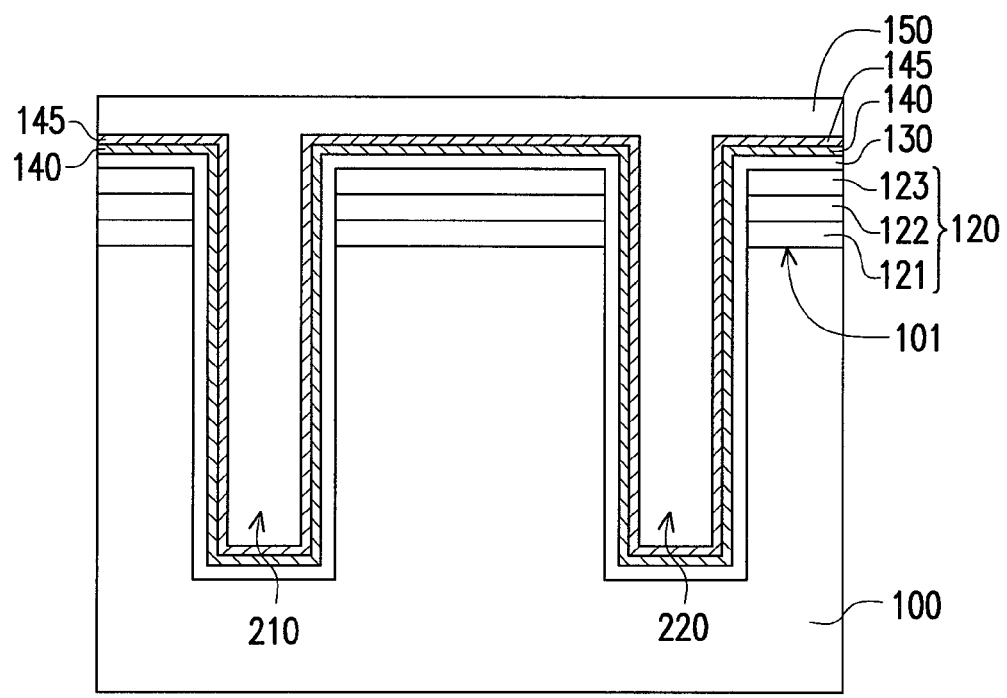
Figure 18:
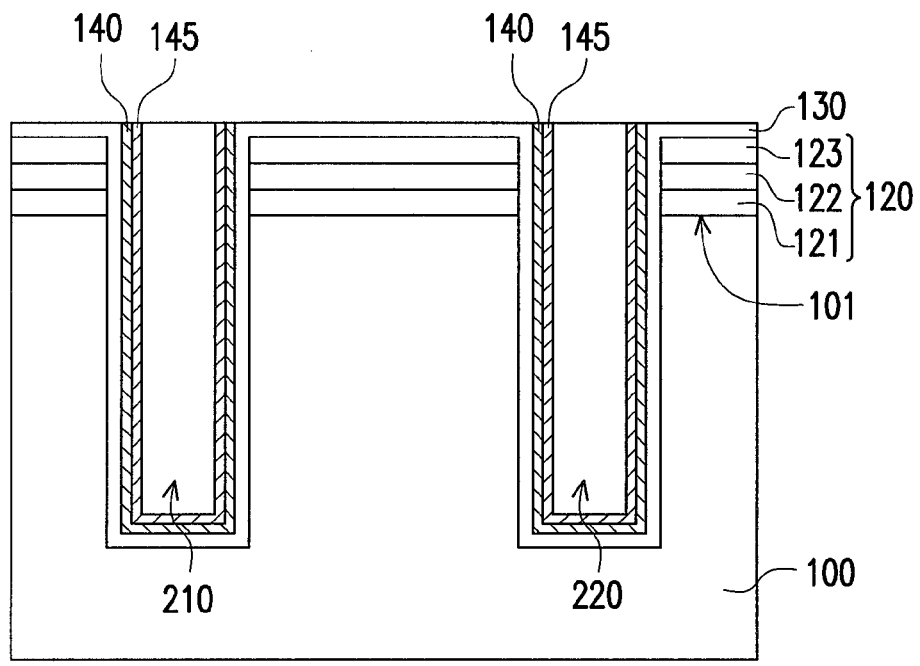

Referring to FIG. 15, at least one opening is formed on the first surface 101 of the substrate 100. Two openings 210 and 220 are illustrated in the embodiments of the disclosure. Referring to FIG. 16, an oxide liner layer 130, a barrier layer 140 and a conductive seed layer 145 are formed on sidewalls and bottoms of the openings 210 and 220 and on the insulating layer 120 above the first surface 101. Referring to FIGS. 17 and 18, after the oxide liner layer 130, the barrier layer 140 and the conductive seed layer 145 are formed, a conductive layer 150 containing a conductive material (e.g. copper) is formed on the barrier layer 140 and the conductive seed layer 145 above the first surface 101 through an ECP process (FIG. 17) and a CMP process (FIG. 18) respectively, and the conductive layer 150, the barrier layer 140 and the conductive seed layer 145 on the oxide liner layer 130 are removed, so as to fill the conductive material into the openings 210 and 220.

Figure 19:
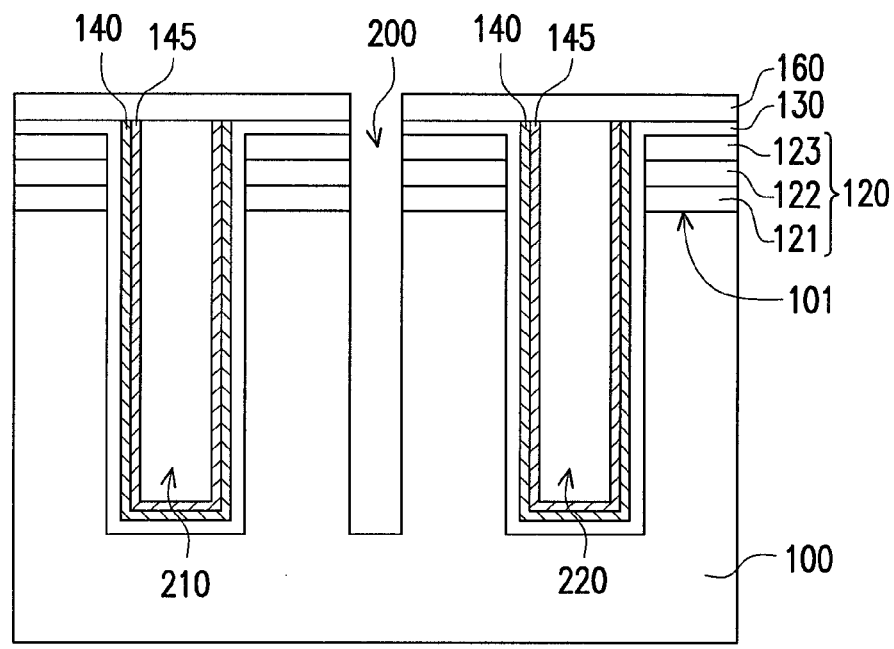
Figure 20:
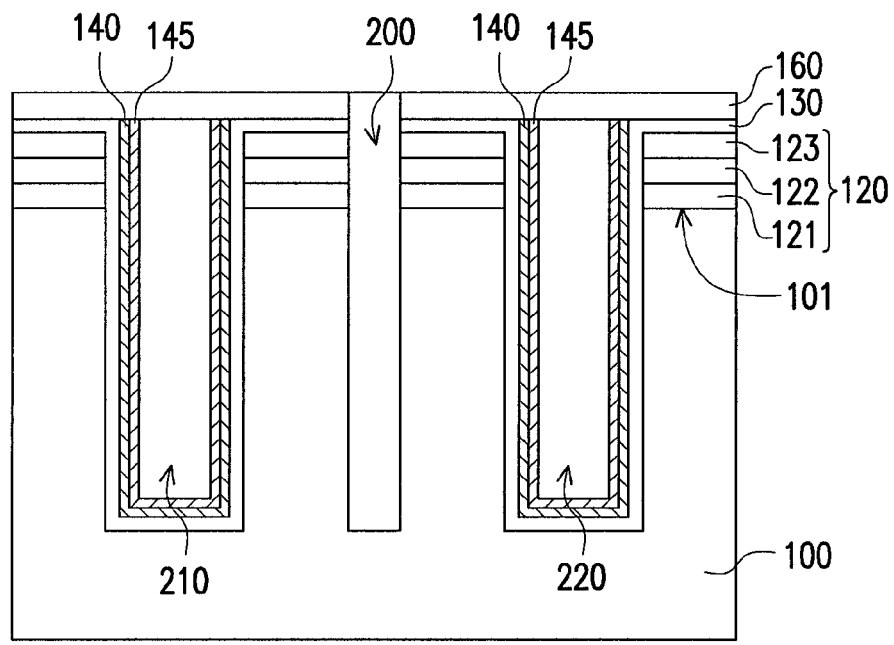
Figure 21:
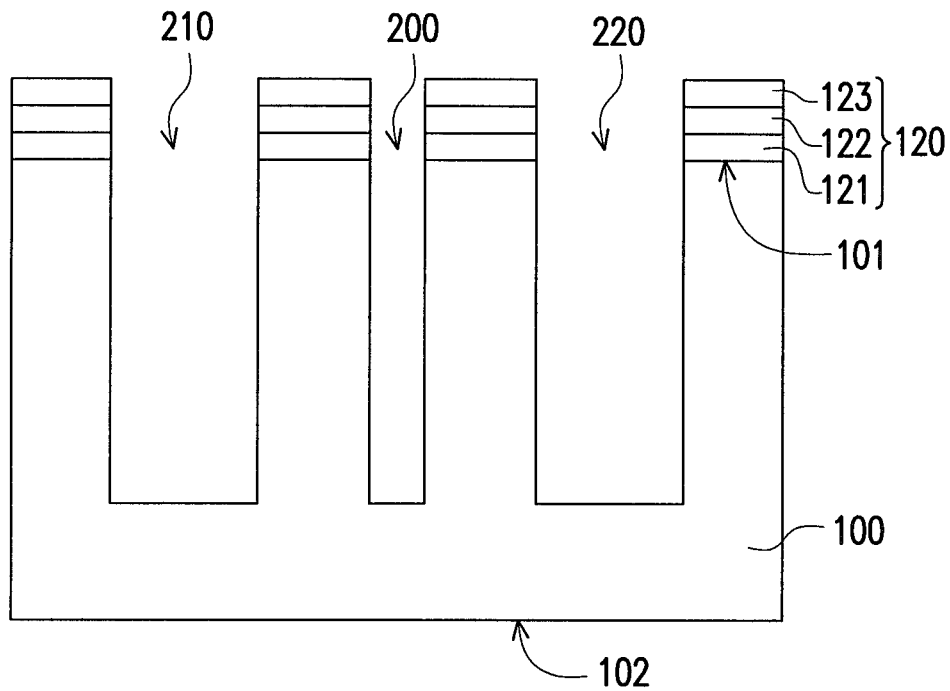
FIGS. 21 to 26 are schematic flowcharts of a method for manufacturing a TSV structure according to the third embodiment of the disclosure.

Referring to FIG. 19, after the conductive material is filled into the openings 210 and 220, a dielectric layer 160 is formed on the oxide liner layer 130 above the first surface 101. Next, a trench 200 is formed on the first surface 101 of the substrate 100, and the locations of the openings 210 and 220 are different from the location of the trench 200. Referring to FIG. 20, a low resistance material (such as p-type silicon, n-type silicon, or a conductive metal) is filled into the trench 200. Thus, the TSV structure may take the trench 200 as the conductive port in the first embodiment to form a capacitance device of a MOS.

Third Embodiment

FIGS. 21 to 26 are schematic flowcharts of a method for manufacturing a TSV structure according to the third embodiment of the disclosure. The major difference between the third embodiment and the first and second embodiments is that the order of each manufacturing step is adjusted; therefore, please refer to the first and second embodiments for the details omitted herein. First, referring to FIG. 21, a substrate 100 having a first surface 101 and a second surface 102 is provided. In addition, an insulating layer 120 is formed on the first surface 101 of the substrate 100. At least one opening and a trench 200 are simultaneously formed on the first surface 101 of the substrate 100. Two openings 210 and 220 are illustrated in the embodiments of the disclosure.

Figure 22:
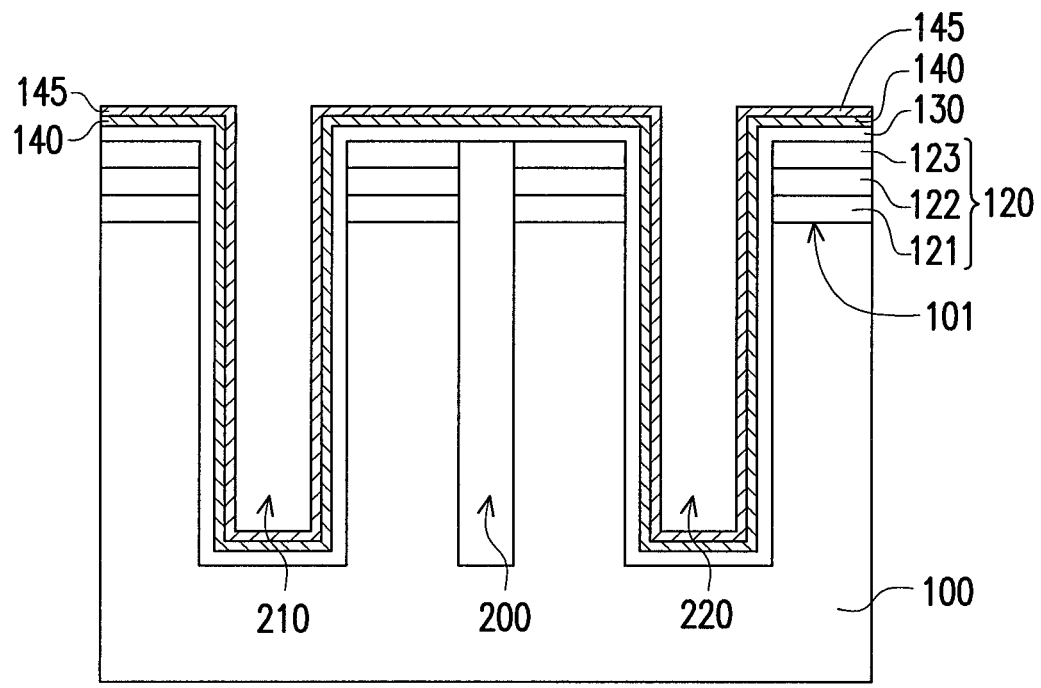

Referring to FIG. 22, an oxide liner layer 130, a barrier layer 140 and a conductive seed layer 145 are formed on sidewalls and bottoms of the openings 210 and 220 and on the insulating layer 120 above the first surface 101. The diameter of the trench 200 may be designed to be slightly smaller, so that the oxide liner layer 130, the barrier layer 140 and the conductive seed layer 145 may not be filled into the trench 200.

Figure 23:
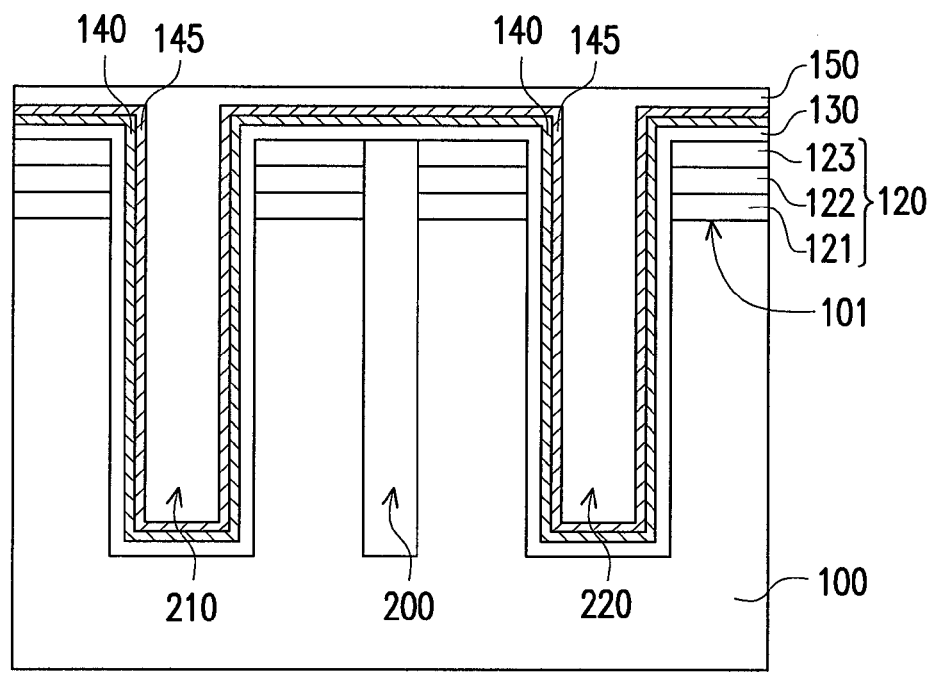
Figure 24:
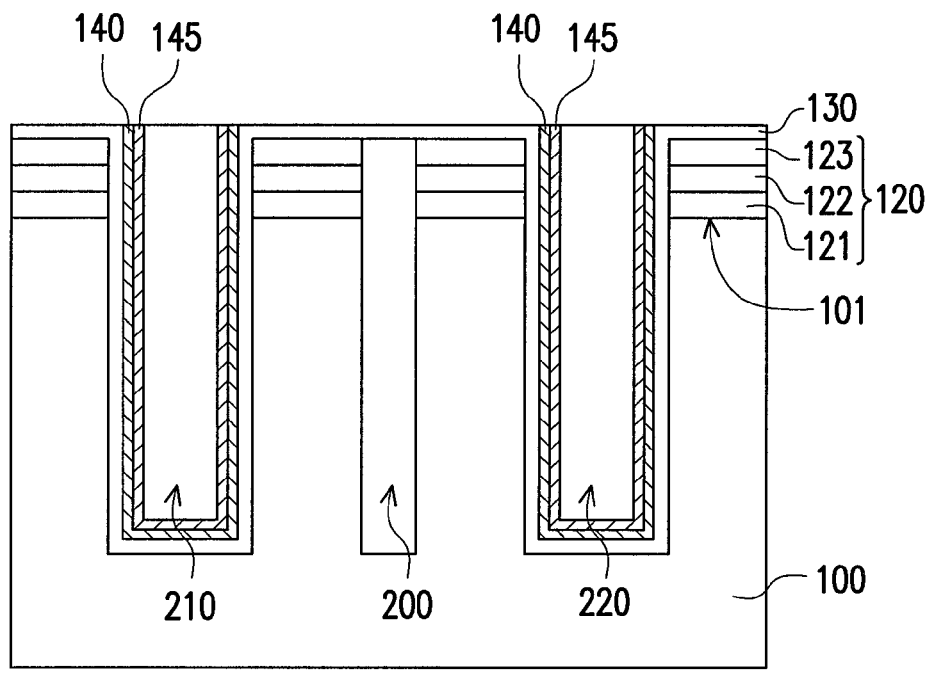

Referring to FIGS. 23 and 24, after the oxide liner layer 130, the barrier layer 140 and the conductive seed layer 145 are formed, a conductive layer 150 containing a conductive material (e.g. copper) is formed on the conductive seed layer 145 and above the first surface 101 through an ECP process (FIG. 23), the barrier layer 140, the conductive seed layer 145 and the conductive layer 150 above the first surface 101 are removed through a CMP process (FIG. 24), so as to fill the conductive material into the openings 210 and 220.

Figure 25:
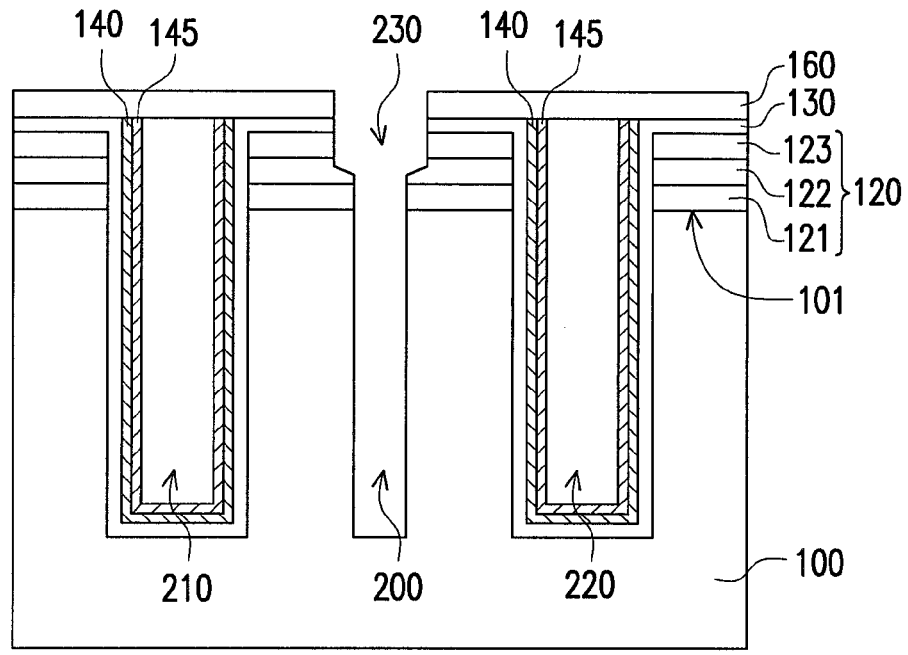

Referring to FIG. 25, after the conductive material is filled into the openings 210 and 220, a dielectric layer 160 is formed on the oxide liner layer 130 above the first surface 101. Next, a body contact hole 230 is formed on the first surface 101 of the substrate 100, and the location of the body contact hole 230 is the same as the location of the trench 200. In the third embodiment, in order to expose the trench 200, the depth to be excavated equals to the thickness of the oxide liner layer 130 and the dielectric layer 160. Distinguished from the first embodiment, the insulating layer 120 does not have to be removed.

Figure 26:
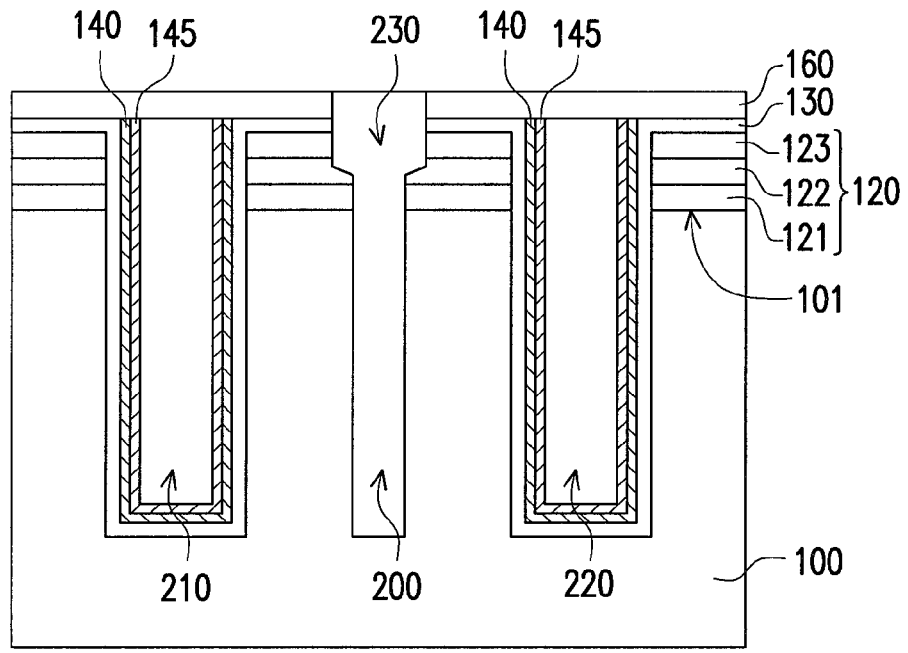

Referring to FIG. 26, after the body contact hole 230 is formed/etched, since the body contact hole 230 is connected with the trench 200, a conductive layer 180 with a low resistance material is filled into the body contact hole 230. Therefore, the openings 210 and 220 and the body contact hole 230 in the TSV structure form a capacitance device of a MOS, and a substrate electric potential of the capacitance device may be controlled precisely. The openings 210 and 220 may be used to form vias. In other words, a portion of the second surface 102 of the substrate 100 is removed to thin the substrate 100 and expose the conductive material in the openings 210 and 220. Then, the openings 210 and 220 become the vias because the conductive material of the openings 210 and 220 penetrates the substrate 100. The vias are conductive holes passing though the substrate 100, so as to conduct two circuits isolated by the substrate 100.

Based on the above, the manufacturing method and the structure of the TSV of the embodiments of the disclosure allow an electric potential at a surface of a substrate and an electric potential at a bottom of the substrate to be approximately the same through a trench containing a low resistance material. Therefore, an electric potential from a surface of a silicon substrate to a bottom of the silicon substrate may be controlled with precision so that a MOS capacitance device in a sidewall of an opening may be controlled precisely. By means that, an electric potential applied from the surface of the silicon substrate may be prevented from decaying due to an internal resistance of the silicon substrate, and the noise in the substrate as well as the signal coupling among conductive openings may be reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for manufacturing a through substrate via (TSV), comprising:
   providing a substrate having a first surface and a second surface;
   forming a trench in the first surface of the substrate;
   filling a low resistance material into the trench;
   forming an insulating layer on the first surface of the substrate;
   forming at least one opening in the first surface of the substrate, wherein a location of the at least one opening is different from a location of the trench;
   forming an oxide liner layer, a barrier layer and a conductive seed layer on a sidewall and a bottom of the at least one opening and on the insulating layer above the first surface;
   filling a conductive material into the at least one opening, wherein the at least one opening is used to form at least one via; and
   after filling the conductive material into the at least one opening, forming a body contact hole on the first surface of the substrate, wherein a location of the body contact hole is the same as the location of the trench.

2. The method for manufacturing the TSV according to claim 1, wherein the trench is located at a geometric center with respect to the at least one opening.

3. The method for manufacturing the TSV according to claim 1, after forming the body contact hole on the first surface of the substrate, further comprising:
   filling the low resistance material or the conductive material into the body contact hole.

4. The method for manufacturing the TSV according to claim 1, wherein the insulating layer is formed by a first silicon nitride layer, a first silicon oxide layer and a second silicon nitride layer.

5. The method for manufacturing the TSV according to claim 1, wherein method of filling the low resistance material into the trench comprises:
   forming a low resistance epi-layer on the first surface of the substrate, wherein the low resistance material of the low resistance epi-layer is filled into the trench; and
   removing the low resistance epi-layer from the first surface.

6. The method for manufacturing the TSV according to claim 1, wherein the low resistance material comprises p-type silicon, n-type silicon, or a conductive metal.

7. The method for manufacturing the TSV according to claim 1, wherein the conductive material is copper.

8. The method for manufacturing the TSV according to claim 1, wherein the method for filling the conductive material into the at least one opening comprises an electrochemical plating process or a chemical mechanical polishing process.

9. The method for manufacturing the TSV according to claim 1, wherein a diameter of the trench or a diameter of the at least one opening is in the range of 0.1 nm to 3 mm.

10. The method for manufacturing the TSV according to claim 1, wherein a diameter of the trench or a diameter of the at least one opening is in the range of 1 μm to 30 μm.

11. The method for manufacturing the TSV according to claim 1, wherein a ratio of a depth of the trench to a depth of the at least one opening is in the range or 0.1% to 99.9%.

12. The method for manufacturing the TSV according to claim 1, wherein a ratio of a depth of the trench to a depth of the at least one opening is in the range of 70% to 99.9%.

13. A control method of a TSV capacitance, comprising:
   providing a substrate and the TSV capacitance, wherein the substrate includes a first surface and a second surface, wherein at least one opening is formed in the first surface of the substrate, wherein a conductive material, a conductive seed layer, a barrier layer and an oxide liner layer are disposed from interior to exterior on a sidewall of the at least one opening, and the TSV capacitance is formed between the conductive material and the substrate, wherein the at least one opening is used to form at least one via;

applying a first voltage to the conductive material of the at least one opening; and applying a second voltage to the substrate to control the TSV capacitance.

14. The control method of the TSV capacitance according to claim 13, further comprising:

forming a trench in the first surface of the substrate, wherein a location of the at least one opening is different from a location of the trench;

filling a low resistance material into the trench; and applying the second voltage to the substrate through the trench.

15. The control method of the TSV capacitance according to claim 14, wherein the location of the trench is at a geometric center with respect to the at least one opening.

16. The control method of the TSV capacitance according to claim 14, further comprising:

forming a body contact hole on the first surface of the substrate and filling the low resistance material or the conductive material being into the body contact hole, wherein a location of the body contact hole is the same as the location of the trench; and applying the second voltage to the substrate through the body contact hole and the trench.

\* \* \* \* \*